US010594078B2

(12) United States Patent
Leigh et al.

(10) Patent No.: US 10,594,078 B2
(45) Date of Patent: Mar. 17, 2020

(54) ROCKER-ARM ASSEMBLIES WITH CONNECTABLE CABLE

(71) Applicant: HEWLETT PACKARD ENTERPRISE DEVELOPMENT LP, Houston, TX (US)

(72) Inventors: Kevin B Leigh, Houston, TX (US); John R Grady, Cypress, TX (US); George D Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 58 days.

(21) Appl. No.: 15/494,443

(22) Filed: Apr. 21, 2017

(65) Prior Publication Data

US 2018/0309236 A1    Oct. 25, 2018

(51) Int. Cl.
*G02B 6/38* (2006.01)
*H01R 13/629* (2006.01)
*H05K 7/14* (2006.01)
*G06K 7/10* (2006.01)
*H01R 13/717* (2006.01)
*H01R 43/26* (2006.01)
*H02G 3/04* (2006.01)
*H04L 12/24* (2006.01)
*H04Q 11/00* (2006.01)

(52) U.S. Cl.
CPC ....... *H01R 13/62933* (2013.01); *G02B 6/389* (2013.01); *G02B 6/3895* (2013.01); *G06K 7/10376* (2013.01); *H01R 13/7172* (2013.01); *H01R 43/26* (2013.01); *H02G 3/04* (2013.01); *H04L 41/12* (2013.01); *H04Q 11/0066* (2013.01); *H05K 7/1491* (2013.01); *H04Q 2011/009* (2013.01); *H04Q 2011/0079* (2013.01)

(58) Field of Classification Search
CPC .......................... G02B 6/389; H01R 13/62933
See application file for complete search history.

(56) References Cited

U.S. PATENT DOCUMENTS

| | | | | |
|---|---|---|---|---|
| 4,151,580 A | * | 4/1979 | Struger | ............... H05K 7/1469 361/755 |
| 4,699,455 A | | 10/1987 | Erbe | |
| 6,302,780 B1 | * | 10/2001 | Ahn | ................... B60H 1/00371 454/136 |

(Continued)

FOREIGN PATENT DOCUMENTS

WO    WO-2015012794    1/2015

OTHER PUBLICATIONS

EPO, Extended European Search Report, dated Oct. 8, 2018, Application No. 18166713.0, 7 pages.

*Primary Examiner* — Daniel Petkovsek
(74) *Attorney, Agent, or Firm* — Hewlett Packard Enterprise Patent Department

(57) ABSTRACT

Examples relate to devices comprising a stationary pivot plenum and a rocker-arm assembly pivotally coupled to the stationary pivot plenum and wherein the rocker-arm assembly comprises an inner conduit having at least one connector bay in which a connector of a cable assembly is removably coupled to the connector bay. In such examples the inner conduit of the rocker-arm assembly is accessible from the outside of the rocker-arm assembly to independently engage/disengage the removable cable assembly to/from the at least one connector bay.

13 Claims, 11 Drawing Sheets

(56) References Cited

U.S. PATENT DOCUMENTS

| | | |
|---|---|---|
| 6,424,781 B1 | 7/2002 | Puetz et al. |
| 7,592,543 B2 | 9/2009 | Caveney et al. |
| 7,916,476 B2 * | 3/2011 | Hsu .................... G06F 1/186 |
| | | 211/41.17 |
| 8,995,812 B2 | 3/2015 | Ciechomski |
| 9,612,415 B2 * | 4/2017 | Adams ................ G02B 6/4442 |
| 9,996,119 B2 * | 6/2018 | Leigh ..................... G06F 1/18 |
| 10,188,012 B2 * | 1/2019 | Leigh ................. H05K 7/1489 |
| 2009/0086463 A1 | 4/2009 | Caveney et al. |
| 2011/0129185 A1 | 6/2011 | Lewallen |
| 2013/0196538 A1 | 8/2013 | Takeuchi |
| 2014/0119704 A1 | 5/2014 | Ciechomski et al. |
| 2016/0124470 A1 | 5/2016 | Leigh |

* cited by examiner

ROCKER-ARM ASSEMBLIES WITH CONNECTABLE CABLE

BACKGROUND

Complex computing infrastructures may have complex fabric topologies to perform their tasks. Data centers may use hardware system frames, such as rack cabinets or racks, to store and connect the electronic equipment forming the complex computing infrastructures. In turn, the electronic equipment in the hardware system frame may include modules such as servers systems, storage systems, network systems, power systems, routing devices such as switches or routers, etc. As computing infrastructures become more complex, new services and functionalities may be added to the hardware system frame, which may incorporate new modules and devices as well as additional dynamic and flexible connections.

BRIEF DESCRIPTION OF THE DRAWINGS

The accompanying drawings illustrate various examples of the principles described herein and are a part of the specification. The illustrated examples are given merely for illustration, and do not limit the scope of the claims.

DETAILED DESCRIPTION

Figure 1:
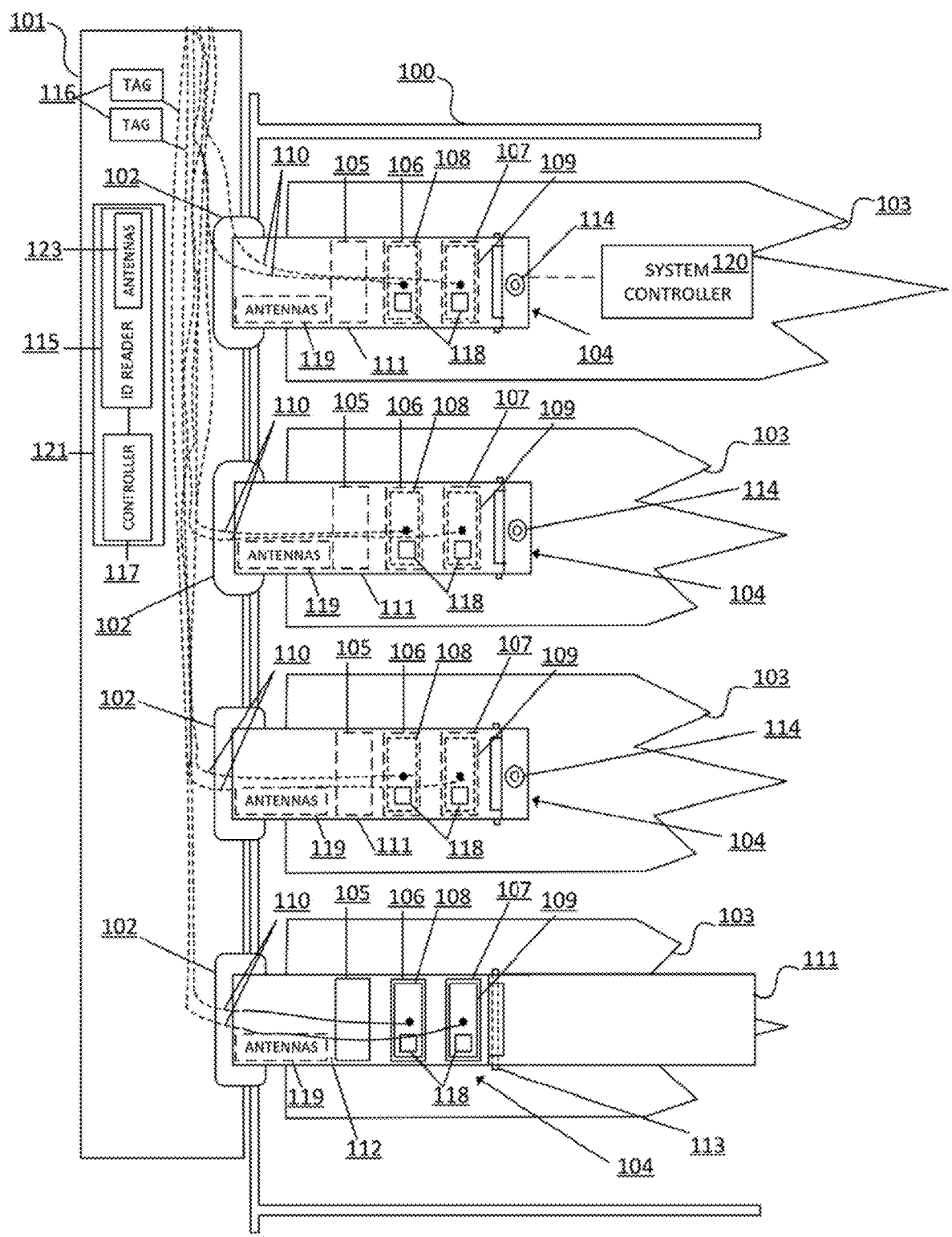
FIG. 1 is a front view of a plurality of example rocker-arm assemblies with connectable cable assemblies, wherein the rocker-arm assemblies are connectable to the faceplate of electronic modules in a hardware system frame.

Complex fabric topologies may be fixed within a hardware system frame, for example a rack cabinet or rack. In racks multiple electronic modules may be stacked either vertically or horizontally. For example, these electronic modules may comprise server systems, storage systems, network systems, routing devices such as switches or routers, etc. The electronic modules in a rack may utilize multiple cables to interconnect the electronic modules. The connection topologies may be complex, e.g., for all-to-all connections where every electronic module needs to connect to every other electronic modules within a rack. It may be too complex to change individual cables on the electronic modules faceplates without causing connection errors without the use of a skilled technician for installing and removing the cables. Besides, the cable connection topologies may be bulky and block air flow to the electronic devices, increasing the risk of an overheated system. Simplifying the cable connection infrastructure for the electronic modules within a rack may be beneficial as it may enhance connection reliability among the electronic modules, accessibility to the electronic modules, and reducing the cable congestions within the rack.

Rocker-arm assemblies may be used to provide services or resources, such as connectivity and power to the electronic modules located in the hardware system frame. The rocker-arm assemblies may house cable assemblies formed by a cable and a cable connector. Examples of cables may be optical waveguides, optical fibers, electrical data transmission cables, power cables, etc., and a combination thereof. The cable connectors may act as interfaces between the cables and the corresponding connectors of the electronic modules in the hardware system frame to which the cables are connected. Examples of cable connectors may be electrical connectors, optical connectors, power connectors, etc., and combinations thereof. Moreover, the rocker-arm assemblies may move between an open position corresponding to a disengaged position of the cable connectors relative to the connectors on the faceplate of the electronic modules in the rack and a closed position corresponding to an engaged position of the cable connectors to the connectors on the faceplate of the electronic modules in the rack.

However, when particular cable assembly from a rocker-arm assembly is added, serviced or removed, the rocker-arm assembly with all its cable assemblies is completely disengaged from the faceplate of the electronic module in the rack to which the rocker-arm assembly is connected, disconnecting the cables assemblies coupled to the rocker-arm assembly and thus disrupting the services provided by the cable assemblies. Therefore, in order to add a new particular cable assembly or remove or service an already deployed particular cable assembly from a plurality of cable assemblies in the rocker-arm assembly, the whole rocker-arm assembly is to be completely disengaged from the faceplate of the electronic module to which is connected, and thus, the services or resources provided by those cable assemblies not directly involved with the addition, removal or service of the particular cable assembly are interrupted.

To address these technical issues, some examples disclosed herein describe devices that may comprise a stationary pivot plenum and a rocker-arm assembly pivotally coupled to the stationary pivot plenum. In turn, the rocker-arm assembly may comprise an inner conduit having at least one connector bay in which a connector of a cable assembly is removably coupled. The inner conduit may be accessible from the outside of the rocker-arm assembly to independently engage the removable cable assembly to the at least one connector bay, to independently disengage the removable cable assembly from the at least one connector bay or to independently service an already deployed removable cable assembly in the rocker-arm assembly. All this, without disrupting service or resource that may provide other cable assemblies in the same rocker-arm assembly to the electronic module to which the rocker-arm assembly is engaged.

In some examples, the cables may be pre-wired cable harnesses that provide a plurality of services or resources. The complex network fabric topology formed by these pre-wired cable harnesses may be modified, by adding additional harnesses and cables or removing existing harnesses and cables, without disengaging already installed harnesses and cables on an existing fabric system topology.

In some examples, the rocker-arm assemblies may have a plurality of connector bays, wherein each connector bay may accept a cable connector.

In some other examples the rocker-arm assembly may comprise light pipes to transfer light beams emitted by indicators in the faceplate of the electronic module to which the rocker-arm assembly is engaged. These indicators in the faceplate of the electronic module are to indicate a connection state of the connectors of the electronic module. For example, this status may be selected between proper seating of cable connectors of the rocker-arm assembly on the connectors of the electronic module, operating status of a connection (e.g., fault or normal) between the cable connectors and the connectors of the electronic modules, removal request approval for a particular cable connector from the respective connector of the electronic module, removal request approval for a particular rocker-arm assembly, etc. The different status may be indicated by LEDs of different colors. In some examples, light pipes may interface with the indicators in the electronic modules transfer light beams to indicators in the rocker-arm assembly that are visible for users.

In some examples, the rocker-arm assembly may comprise a request button that is to be depressed by a user to request disconnection of a cable connector within the rock-arm assembly. In response to the activation of the request button, the indicators of the electronic module may illuminate with a color to indicate to the user that a cable connector from the rocker-arm assembly is to be disengaged from the faceplate of the electronic module in the rack. In another example, there may be an additional request button to allow disconnection of the entire rocker-arm assembly.

In some other examples the stationary pivot plenum may be a cable spine. In some other examples, the stationary pivot plenum may comprise a cover pivotally attached to the stationary pivot plenum to allow access to the cables housed in the stationary pivot plenum.

In some other examples, the stationary pivot plenum and the rocker arm assemblies may house powered components, for example electronic or opto-electronic components, allowing power to be delivered to the powered components. In one example, the powered components may be used to detect the fiber harnesses and/or to support low-power switching functions. In another example, the powered components may be used to provide routing function such as an optical circuit switch.

As used herein, the term "module" or "electronic module" is meant to be understood broadly as any electronic device that may be stored in a rack. Examples of modules include servers, blade servers, blade switches, network systems, storage systems, power systems, routing systems among other electronic devices.

Further, as used herein, the term "cable connector" is meant to be understood broadly as any device that may interface between a cable providing a service, such as connectivity and power, and a corresponding connector on a module of a rack. The cable connector may also supply a resource to the module. As used herein, "services" or "resources" refers to the bidirectional transmission of data or power between the cable assemblies in the rocker-arm assembly and the electronic modules to which the rocker-arm assembly is engaged. For example, the cable connectors may supply electrical power and electrical transmission lines to the electronic module. Other examples of resources supplied include, but are not limited to, optical waveguides and optical signals for transmitting data.

Even further, as used herein, the term "hardware system frame", "rack", "rack cabinet" or similar language is meant to be understood broadly as any structure that may house a plurality modules. The hardware system frame serves as a gateway for electrical power and transmission signals, among other resources. For example, a server installed in system enclosures mounted in racks uses multiple printed circuit boards in various orientations to contain and connect electronic components including processors, memory devices, input/output devices, and storage devices. These servers are used in system enclosures that are mounted in racks. The racks may be arranged in datacenter rooms.

Even still further, as used herein, the term "stationary pivot plenum" is meant to be understood broadly as an structure that may house a plurality of independent cables, pre-wired cable harnesses or similar, and cable connectors installed on respective rocker-arm assemblies. In some examples the stationary pivot plenum may be a cable spine.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a front view of a plurality of example rocker-arm assemblies 104 with cable assemblies, formed by cables 110 and their respective cable connectors 108-109, connected to the faceplate of modules 103 in a hardware system frame 100, such as a rack. The rocker-arm assemblies 104 are pivotally coupled to a stationary pivot plenum 101 by interposition of pivoting elements 102, such as hinges. The pivoting elements 102 allow the rocker-arm assemblies 104 to rotate about the stationary pivot plenum 101. The stationary pivot plenum 101 may be, for example, a cable spine. The stationary pivot plenum 101 comprises a conduit 112 that houses cables 110 supplying different resources to the modules 103. For example, the conduit of the stationary pivot plenum 101 may house optical waveguides, optical fibers, electric data transmission cables, power cables or a combination thereof, that supply resources to the modules 103. The stationary pivot plenum 101 hides cables 110 and may also comprise a movable cover (not shown in the figure) coupled to the stationary pivot plenum 101 by means of pivoting elements (not shown in the figure), such as hinges, that moves relative to the stationary pivot plenum 101 between an open position and a closed position. The movable cover of the stationary pivot plenum 101 in its open position allows a user to add, remove or manipulate the cables inside the stationary pivot plenum 101. In some examples, the stationary pivot plenum 101 may be a vertical cable spine conduit attached to the rack 100 by interposition of a bracket, for example a cable spine bracket. In some other examples, the stationary pivot plenum 101 may be directly coupled to the rack 100. While FIG. 1 depicts four rocker-arm assemblies 104, any number of rocker-arm assemblies 104 may be movably coupled to the stationary pivot plenum 101.

FIG. 1 also depicts four modules 103 disposed in the rack 100 with the modules 103 being horizontally oriented, stacked one on top of the other. Examples of electronic modules 103 may be blade servers, storage systems, network systems, switches, and other electronic devices. While FIG. 1 depicts four modules 103, any number of modules 103 may be stacked in the rack. Additionally, while FIG. 1 depicts one rocker arm assembly 104 coupled to each module 103, any number of rocker-arm assemblies 104 may be coupled to each module 103.

The rocker-arm assemblies 104 may rotate about the longitudinal axis of the stationary pivot plenum 101 by the corresponding pivoting element 102 defining an open position and a closed position. The open position corresponds to a disengaged position of the cable assemblies, in particular the cable connectors 108-109, and the closed position corresponds to an engaged position of the cable assemblies. The rocker-arm assemblies 104 may swing open to disengage all cable connectors in the rocker-arm assembly 104 from the faceplate of the module 103 and to allow the installation of a new module 103, servicing an existing module 103 or removal of an installed module. The rocker-arm assemblies 104 may also swing closed to engage all cable connectors in the rocker-arm assembly 104 to a previously installed module 103.

In the example of FIG. 1, the rocker-arm assemblies 104 comprise three connector bays 105-107, wherein the connector bay 105 is unused yet in this example, and each connector bay 106-107 is to house one cable connector 108-109, respectively. In some other examples, the rocker-arm assemblies 104 may comprise a different number of connector bays depending on the number of connectors on the faceplate of the modules 103. In such example, each rocker-arm assembly 104 houses two cable assemblies connected to the modules 103 through respective connector bays 106-107. In particular, cable connector 108 is removable housed in connector bay 106 and cable connector 109 is removable housed in connector bay 107. The cable connectors 108-109 are coupled to the respective connector bays 106-107 by retention mechanisms that may comprise magnets, mechanical means, electrical means, or a combination thereof, to secure the cable connectors 108-109 to the connector bays 106-107 in a position. Connector bay 105 is empty in this example and is available to receive a new cable assembly. The cable connectors 106-107 interface with corresponding connectors (not shown in the figure) on the modules 103 and supply a resource to the module 103. Specifically, the cable connectors 106-107 may provide data signals to the module 103, may provide management signals to the module 103, may receive electrical power from the module 103, or a combination thereof. For example, cable connector 106 may be an optical interface that provides an optical signal to the module 103. Examples of optical interfaces include optical glass fibers and optical connectors. Other examples of devices that propagate an optical signal may be optical plastic fibers and polymer waveguides, etc. In some examples, the stationary pivot plenum 101 may also include other devices that modify an optical signal. Examples of devices that modify an optical signal may be a wavelength multiplexer, a wavelength demultiplexer, a bus, a switch, a splitter, a combiner, a transponder, and an amplifier, etc. While FIG. 1 depicts connector bays 105-107, and respective connectors in the faceplate, transversally positioned relative to the longitudinal axis of the rocker-arm assemblies 104, the connector bays 105-107 may alternatively be longitudinally positioned.

In such example, the rocker-arm assemblies 104 comprise a conduit 112 that houses the cable assemblies and that is accessible from outside. Said conduit 112 may house cables 110, such as optical waveguides, optical fibers, electric data transmission cables, power cables or a combination thereof, that supply resources to the modules 103 and the corresponding connectors. The rocker-arm assemblies 103 may also house cables 110 that supply power from the modules 103. Accordingly, the conduit 112 and the stationary pivot plenum 101 may house powered components, such as electronic and opto-electronic components or optical circuit switch components, that may be used to detect the fiber harnesses and/or to support low-power switching functions. Examples of other electronic components that may be housed within the rocker-arm assemblies 104 and the stationary pivot plenum 101 are signal repeaters, amplifiers, optical circuit switches, wavelength converters, and other electrical, electronic or opto-electronic components. The conduit 112 protects and hides cables and provides a greater and cheaper connectivity in a small volume space. The conduit 112 also allows smaller protection jackets for the loose fibers reducing the cable bulk for lower cost installations. The conduit 112 may further allow passive optical components, such as mandrels. In an example, a mandrel may be used to filter unwanted optical signal modes in optical fibers by wrapping the optical fibers around the mandrel.

In some examples, the rocker-arm assemblies 104 may have an upper aperture to make cable assemblies accessible from outside, such that cable assemblies can be added, removed or serviced. In some other examples, the rocker-arm assemblies 104 comprise a movable cover 111 that is movable between an open position and a closed position to make the conduit 112 accessible from outside. When the movable cover 111 is in the open position engage/disengage of cable connectors 108-109 to/from the connector bays 105-107 is allowed. Servicing of already deployed cable assemblies is also allowed. The movable cover 111 may be coupled to the rocker-arm assembly by pivoting elements 113, such as a hinge or similar, that allow movement of the cover 111 relative to the rocker-arm assembly 104 between an open position and a closed position. The access to the inside of the rocker-arm assemblies allows independently engaging/disengaging of cable assemblies to the faceplate of the modules 103 of the rack without disrupting connection services to the system. For example, cable connector 109 may be disengaged from the connector bay 107 without disrupting service provided by cable connector 108 that is housed in connector bay 106 or a new cable connector (not shown in the figure) may be housed in connector bay 105 without disrupting services provided by cable connectors 106,107. In the example of FIG. 1, the three upper rocker-arm assemblies 104 are shown with the movable cover 111 in its closed position and the lower rocker-arm assembly is shown with the movable cover 111 in its open position.

In some examples, the rocker-arm assemblies 104 may also comprise guiding elements, such as slots, wheels or tubes, in the conduit 112 to guide and protect the cables 110. The guiding elements may avoid kinking, over-extension, and other conditions that may affect resource transmission through the cables 110.

The cable assemblies may move between an engaged position and a disengaged position. An engaged position may be defined as a position in which the cable connector 108-109 is removably housed into the corresponding connector bay 105-107 and connects with a module 103 of the rack 100 for providing a resource. In particular, in the engaged position, the cable connectors 108-109 contact with respective connectors on the faceplate of the modules 103 in the rack 100. By comparison, a disengaged position may be defined as a position in which the cable assemblies are free, or disengaged, from the modules 103 of the rack 100.

In the example of FIG. 1, the rocker-arm assemblies 104 comprise respective rocker-arm retention mechanisms 114 to retain the rocker-arm assemblies 104, and thus the cable connectors 108-109, in a position. For example, a rocker-arm retention mechanisms 114 may secure the rocker-arm assemblies 104 in a closed position. The rocker-arm retention mechanisms 114 may utilize magnets, mechanical means, electrical means, or a combination thereof, to secure the rocker-arm assemblies 104, and the cable connectors 108-109, to the connectors of the modules 103 in the rack 100 in a position.

In the example of FIG. 1, the stationary pivot plenum 101 houses a first ID reader 115 and the cable or cable harnesses 110 have a first ID tag 116 attached to them such that the first ID reader 115 may detect the cables or cable harnesses 110 deployed into the stationary pivot plenum 101. In particular, the first ID reader 115 may comprise at least one antenna 123 to detect the presence of the first ID tags 116. The first ID reader 115 may further read or write the first ID tags via the respective antennas. Detecting the cables or cable harnesses 110 deployed into the stationary pivot plenum 101 may allow, for example, discovering cables/harnesses being installed/removed, discovering installed cable/harness configurations, etc. The first ID reader 115 communicates with a plenum controller 117 and both elements may be mounted on a printed circuit board (PCB) 121 located in the stationary pivot plenum 101. The PCB 121 is connected to a system controller 120 located on one of the electronic modules 103 (for example the upper electronic module in FIG. 1) via the corresponding rocker arm-assembly 104. This upper electronic module 103 may be a dedicated management module 103 to provide power to powered components in the stationary pivot plenum control 101 and receive management signals from the plenum controller 117. In some other examples the management module 103 may have a dual function comprising providing power to powered components in the stationary pivot plenum 101, receiving management signals from the plenum controller 117 but also providing an additional service such as connectivity services. In addition, the cable connectors 108-109 in rocker-arm assemblies 104 have ID tags 118 attached to them. In one example, the ID tags 118 may be detected and read by the second ID reader (not shown in the figure) located in the corresponding electronic modules 103, to identify the connectors 108,109 that are installed on the connector bays 106,107. In such example, the second ID reader in the electronic modules 103 may be connected to the system controller 120 in the management module 103. In another example, the ID tags 118 may be detected by antennas 119 in the rocker-arm assembly 104, and read by the first ID reader 115 in the stationary pivot plenum 101. The antennas 119 may be organized in a way that they may detect the connector 108 in the connector bay 106, and the connector 109 in the connector bay 107. The antennas 119 may be electrically coupled to the first ID reader 115 via an electrical connector (not shown) along with the pivoting element 102.

In some other examples, the plenum controller 117 may further detect engagement of the rocker-arm assemblies 104 to the corresponding electronic modules, control the optical switches in the stationary pivot plenum 101, detect optical signal statuses, etc.

Implementing the rocker-arm assemblies 104 with cable assemblies that are removably coupled to the connector bays 105,106,107 and are accessible from outside by a user as described herein, may be beneficial in that it allows to actively modify the services provided to the installed modules 103 (servers, switches, among other modules) without disrupting other services already deployed in the same modules 103. For example, it may allow to remove, add or replace optical connectors to change a network connection topology. It also avoids the installation or removal of complex cable infrastructure within the stationary pivot plenum 101.

It should be understood that the plurality of example rocker-arm assemblies 104 depicted in FIG. 1 may include additional components and that some of the components described herein may be removed and/or modified without departing from a scope of the rocker-arm assemblies 104.

Figure 2:
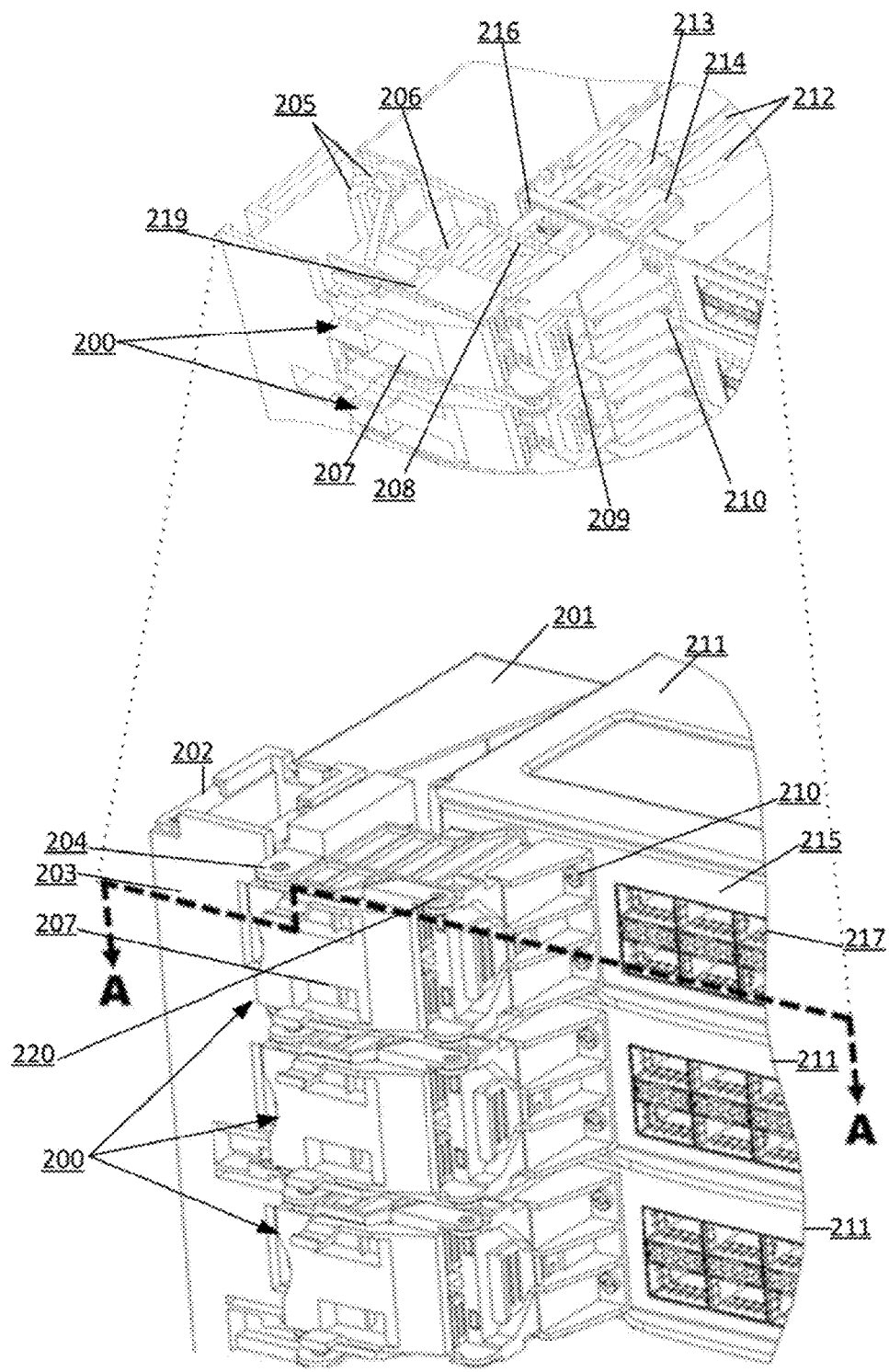
FIG. 2 is a perspective view of example rocker-arm assemblies with connectable cable assemblies wherein the rocker-arm assemblies are connected to the faceplate of electronic modules, including a cross sectional view of the example rocker-arm assemblies along line A-A.

FIG. 2 is a perspective view of example rocker-arm assemblies 200 with connectable cable assemblies connected to the faceplate 215 of respective electronic modules 211, including a cross sectional view of the example rocker-arm assemblies 200 along line A-A. It should be understood that the rocker-arm assemblies 200 depicted in FIG. 2 may include additional components and that some of the components described herein may be removed and/or modified without departing from a scope of the rocker-arm assemblies 200.

The electronic modules 211 comprise two optical connectors 213-214 connected to optical devices (not shown) integrated in the module 211. The optical connectors 213-214 may comprise a housing 216 and an optical ferrule. The optical devices of the modules 211 are connected to the optical connectors 213-214 by respective optical fibers 212.

The rocker-arm assemblies 200 are rotatably coupled to a stationary pivot plenum 202, along which optical cables 205 are guided, by interposition of a hinge 204. In some other examples, the stationary pivot plenum 202 may guide cable harnesses. The stationary pivot plenum 202 is, in turn, attached to a rack (not shown) holding the electronic modules 211 by a stationary pivot plenum bracket 201. The stationary pivot plenum 202 guides and hides the optical cables 205 that are connected to cable connectors 208 removably coupled to connector bays 206 in the rocker-arm assemblies 200. The stationary pivot plenum 202 further comprises a movable cover 203 pivotally coupled to the stationary pivot plenum 202 by means of a hinge or similar. The movable cover 203 of the stationary pivot plenum 202 moves between an open position and a closed position in such a way that when the movable cover 203 is opened allows a user to add a new cable and remove or manipulate cables 205. While FIG. 2 depicts two connector bays 206 in the rocker-arm assembly 200 and two corresponding optical connectors 213-214 in the electronic module 211, the rocker-arm assembly 200 may comprise any number of connector bays 206 depending on the number of connectors 213-214 in the electronic modules 211.

The rocker-arm assemblies 200 include a rocker-arm retention mechanism that secures the rocker-arm assembly 200 in a closed position. In some examples the rocker-arm retention mechanism comprises a snap or rocker-arm cantilever latch 209 in the rocker-arm assembly 200 that is attached to a latch bracket 210 on the faceplate 215 of the electronic module 211. Other examples of rocker-arm retention mechanisms may include latches, magnets, electromagnets, mechanical clips, springs, etc. In such closed position, the cable connector 208 of the rocker-arm assembly 200 is inserted into the housing 216 of the optical connector 213 of the electronic module 211 and the optical ferrule of the cable connector 208 contacts the optical ferrule of the optical connector 213 allowing the transmission of optical signals. In such example, the faceplate 215 of the electronic modules 211 further comprise a plurality of connectors 217 such as QSFP Ethernet transceiver cages, RJ45 management connectors, etc.

In such example, the rocker-arm assemblies 200 further comprise a movable cover 207 that is movable between an open position and a closed position to make a conduit 219 inside the rocker-arm assembly 200 accessible from outside. When the movable cover 207 is in the open position engagement/disengagement of cable connector 208 to/from the connector bays 206 is allowed. Servicing of already deployed cable assemblies is also allowed. In such example, the movable cover 207 is shown in its closed position. The movable cover 207 may be coupled to the rocker-arm assembly 200 by a hinge 220 at one of its ends and by a cover retention mechanism, such as a bolt and nut, locking pin, a tie, or similar, at the opposite end. The hinge 220 allows movement of the movable cover 207 relative to the rocker-arm assemblies 200 between an open position and a closed position. The access to the inside of the rocker-arm assemblies 200 allows engaging/disengaging of cable assemblies to the faceplate 215 of the modules 211 of the rack without disrupting services provide by others cable assemblies already deployed in the rocker-arm assemblies 200 to the electronic modules 211. In some other examples, the rocker-arm assembly 200 may have an opening instead of the cover 207 to allow access to the conduit 219 inside the rocker-arm assembly 200.

FIGS. 3A through 3D are perspective views of example stages of connection of cable assemblies in the example rocker-arm assemblies of FIG. 2. It should be understood that the rocker-arm assemblies 200 depicted in FIG. 3A through 3D may include additional components and that some of the components described herein may be removed and/or modified without departing from a scope of the rocker-arm assemblies 200.

Figure 3A:
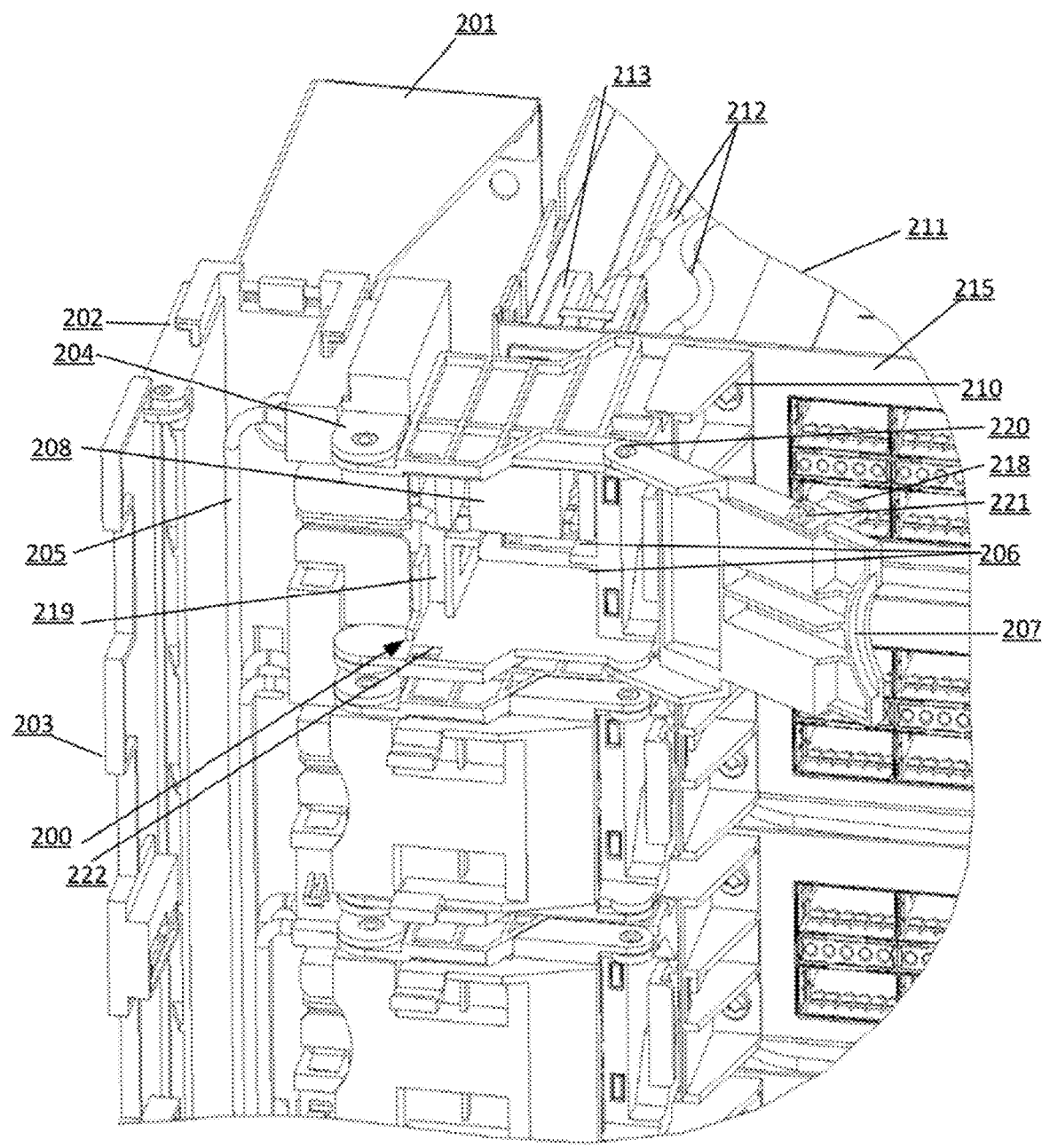
FIGS. 3A through 3D are perspective views of example stages of connection of connectable cable assemblies in the example rocker-arm assemblies of FIG. 2.

FIG. 3A is a perspective view of an example first stage of a process for connecting an additional cable assembly to the rocker-arm assembly 200 that is already connected to the faceplate 215 of the electronic module 211. The already deployed cable assembly comprises the optical cable 205 that is installed and guided by the stationary pivot plenum 202 and a cable connector 208 that has been removably coupled to one of the two connector bays 206 in the rocker-arm assembly 200 by, for example, a click mechanism that temporarily retains the cable connector 208 in the connector bay 206. The rocker-arm assembly 200 has a second connector bay 206 that is empty to house a second cable connector. In the example of FIG. 3A, the movable cover 207 of the rocker-arm assembly 200 and the movable cover 203 of the stationary pivot plenum 202 are opened to allow the addition of a new cable assembly or a cable harness comprising a plurality of cables or wires. The opening position of the movable covers 203,207 may also allow the removal of the already installed optical cable 205 by disengaging the cable connector 208 from the rocker-arm assembly 200 and thus from the faceplate 215 of the electronic module 211, or the servicing of the cable connector 208 or cable 205. The cover 207 further comprises rocker-arm cover retention tabs 221 to retain the cover in its closed position and rocker-arm cover cantilever latches 218 that when pressed releases the rocker-arm cover retentions tab 221 from slots 222 in the rocker-arm assembly 200.

Figure 3B:
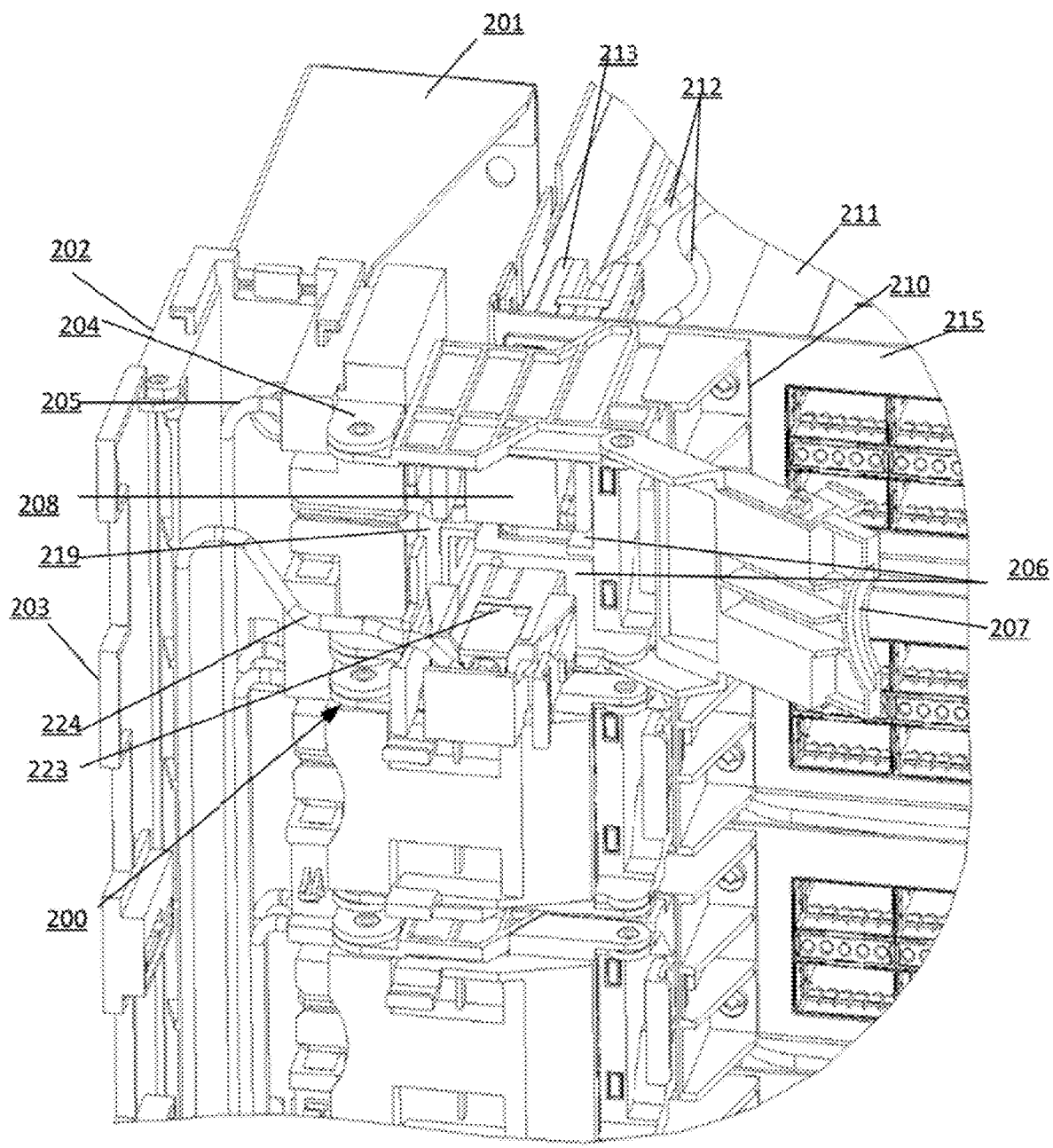

FIG. 3B is a perspective view of an example second stage of the process for connecting the additional cable assembly to the rocker-arm assembly 200. This second stage comprises deploying the cable assembly, comprising a cable connector 223 and a cable 224, within the stationary pivot plenum 202. During the deployment of the cable 224 the movable covers 203,207 remain opened allowing full access to the inside of the stationary pivot plenum 202 and to the conduit 219 of the rocker-arm assembly 200. This additional cable assembly may provide a new service to the already installed electronic module 211.

Figure 3C:
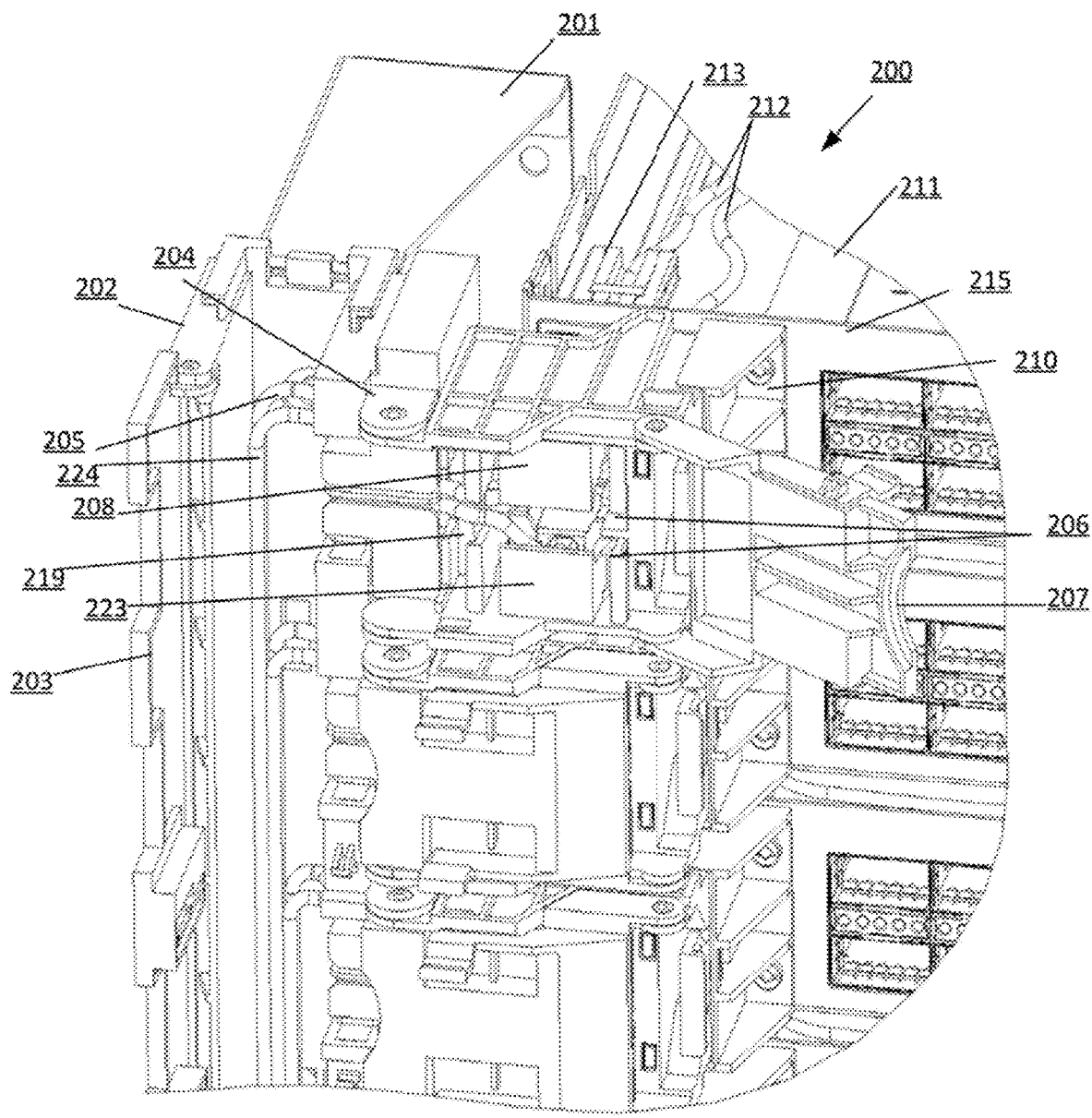

FIG. 3C is a perspective view of an example third stage of the process for connecting the additional cable assembly to the rocker-arm assembly 200. This third stage comprises inserting the cable connector 223 into the empty connector bay 206 such that the cable connector 223 is retained inside the connector bay 206 by a retaining mechanism, for example a click mechanism. The cable connector 223 further inserts into the housing of the corresponding optical connector in the electronic module 211 such that the optical ferrule of the cable connector 223 contacts the optical ferrule of the corresponding optical connector (not shown in the figure) allowing the added cable assembly to provide the new service to the electronic module 211. The cable 224 is housed into the conduit 219 of the rocker-arm assembly 200 to be hidden and protected.

Figure 3D:
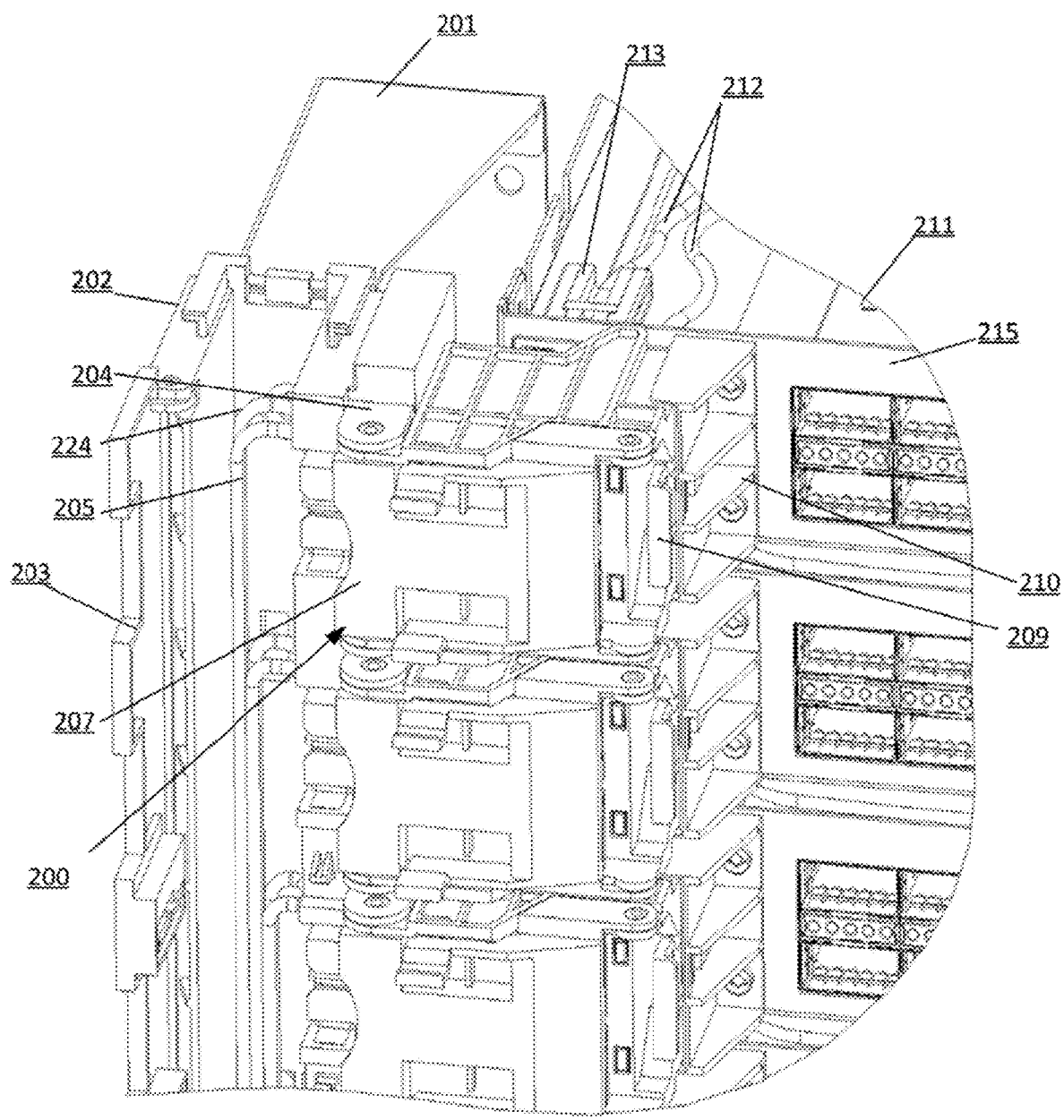

FIG. 3D is a perspective view of an example fourth stage of the process for connecting the additional cable assembly to the rocker-arm assembly 200. This fourth stage comprises closing the two movable covers 203,207 for completely hiding and protecting the cable assembly. This process avoids disruption of the service provided by the other cable assembly in the rocker-arm assembly 200 during installation of the new cable assembly since there is no need for disengaging the rocker-arm assembly 200 from the faceplate 215 of the module 211.

Figure 4A:
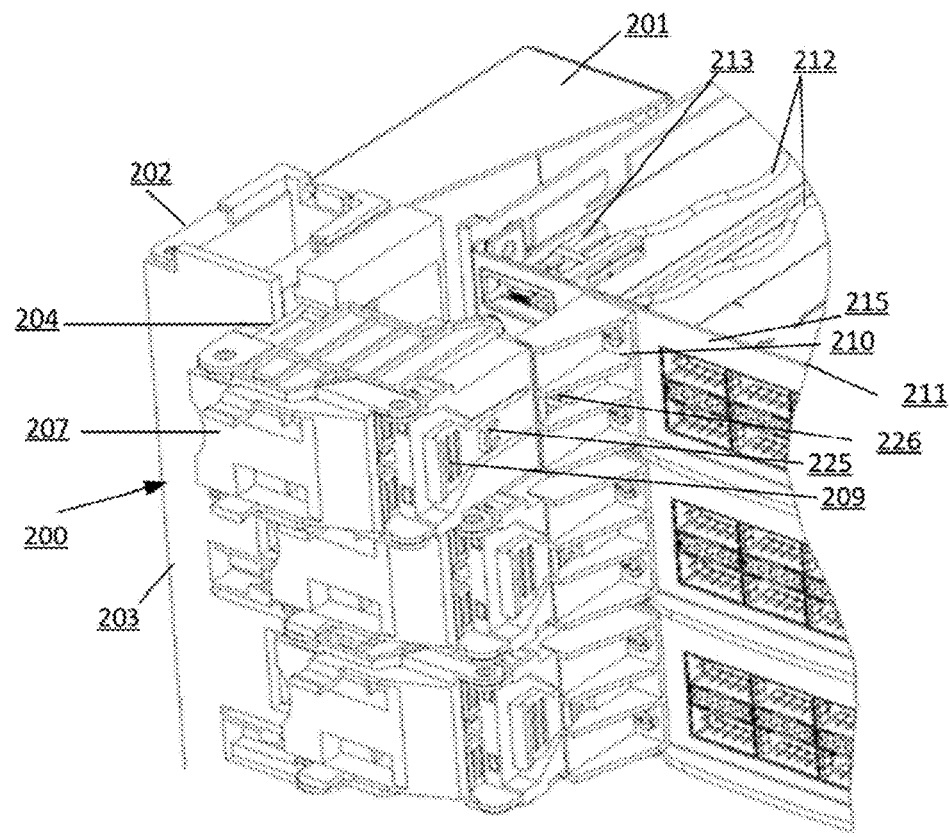
FIGS. 4A and 4B are perspective views of example stages of disconnection of the example rocker-arm assembly of FIG. 3D.
Figure 4B:
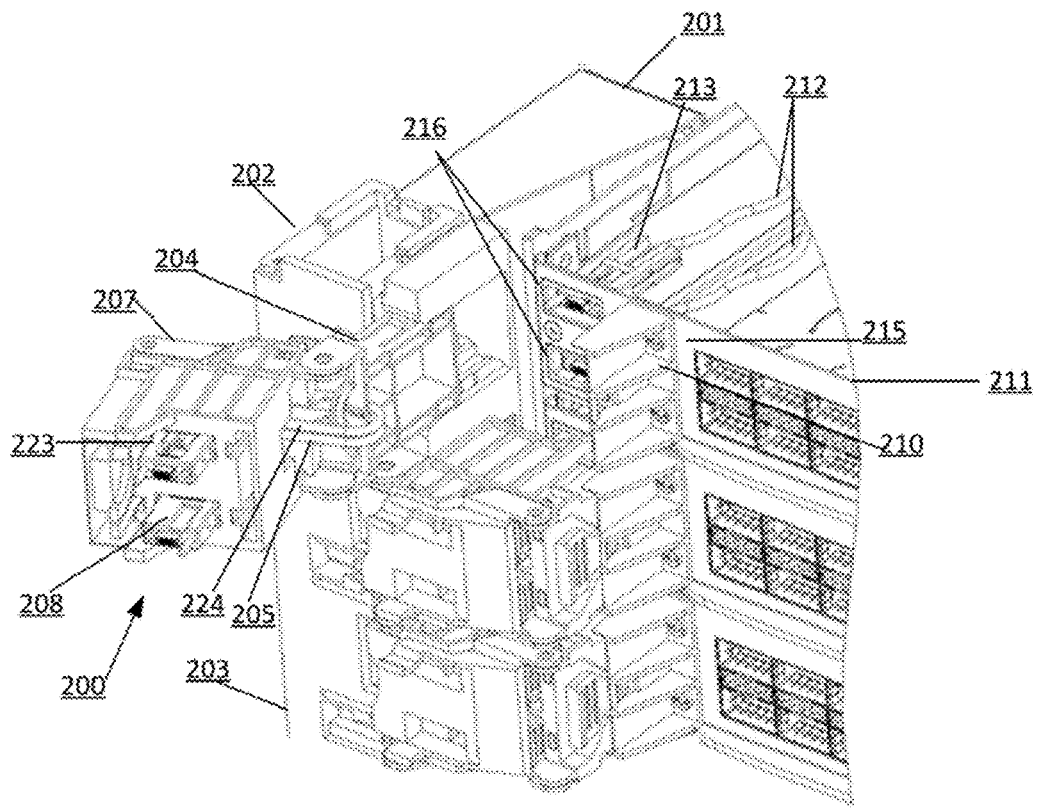

FIGS. 4A and 4B are perspective views of example stages of disconnection of the example rocker-arm assembly 200 of FIG. 3D. It should be understood that the rocker-arm assembly 200 depicted in FIGS. 4A and 4B may include additional components and that some of the components described herein may be removed and/or modified without departing from a scope of the rocker-arm assembly 200.

FIG. 4A is a perspective view of an example first stage of a process for disconnection the rocker-arm assembly 200 from the faceplate 215 of the electronic module 211. In this first stage the rocker-arm cantilever latch 209 that is attached to a latch bracket 210 on the faceplate 215 of the electronic module 211 is pressed releasing a rocker-arm retention tab 225 in the rocker-arm cantilever latch 209 from a slot 226 in the latch bracket 210. Then, the rocker-arm assembly 200 is pulled away from the electronic module 211 by means of a guide (not shown) coupled between the hinge 204 and the stationary pivot plenum 202. This guide allows to outwardly moving the rocker-arm assembly relative to the electronic module 211 a distance enough to release the cable connectors 208,223 from the housing of the respective connectors 213,214.

FIG. 4B is a perspective view of an example second stage of a process for disconnecting the rocker-arm assembly 200 from the faceplate 215 of the electronic module 211. The second stage comprises the rocker-arm assembly 200 swung open relative to the electronic module 211. The rocker-arm assembly 200 may be rotated about a longitudinal axis of the stationary pivot plenum 202. As the rocker-arm assembly 200 is rotated, the cables 205,224 housed in the conduit 219 are also rotated. As described above, in some examples, the rocker-arm assembly 200 may comprise a plurality of cable management devices that ensure that cables 205,224 do not kink or over-extend. FIG. 4B corresponds to the open position of the rocker-arm assembly 200. In this stage, the existing module 211 may be serviced, removed or replaced with a new module. In some examples, a rocker-arm assembly 200 may be in the open position while a plurality of other rocker-arm assemblies 200 are in the closed position while all the rocker arm assemblies are rotatably mounted on the same stationary pivot plenum.

Figure 5:
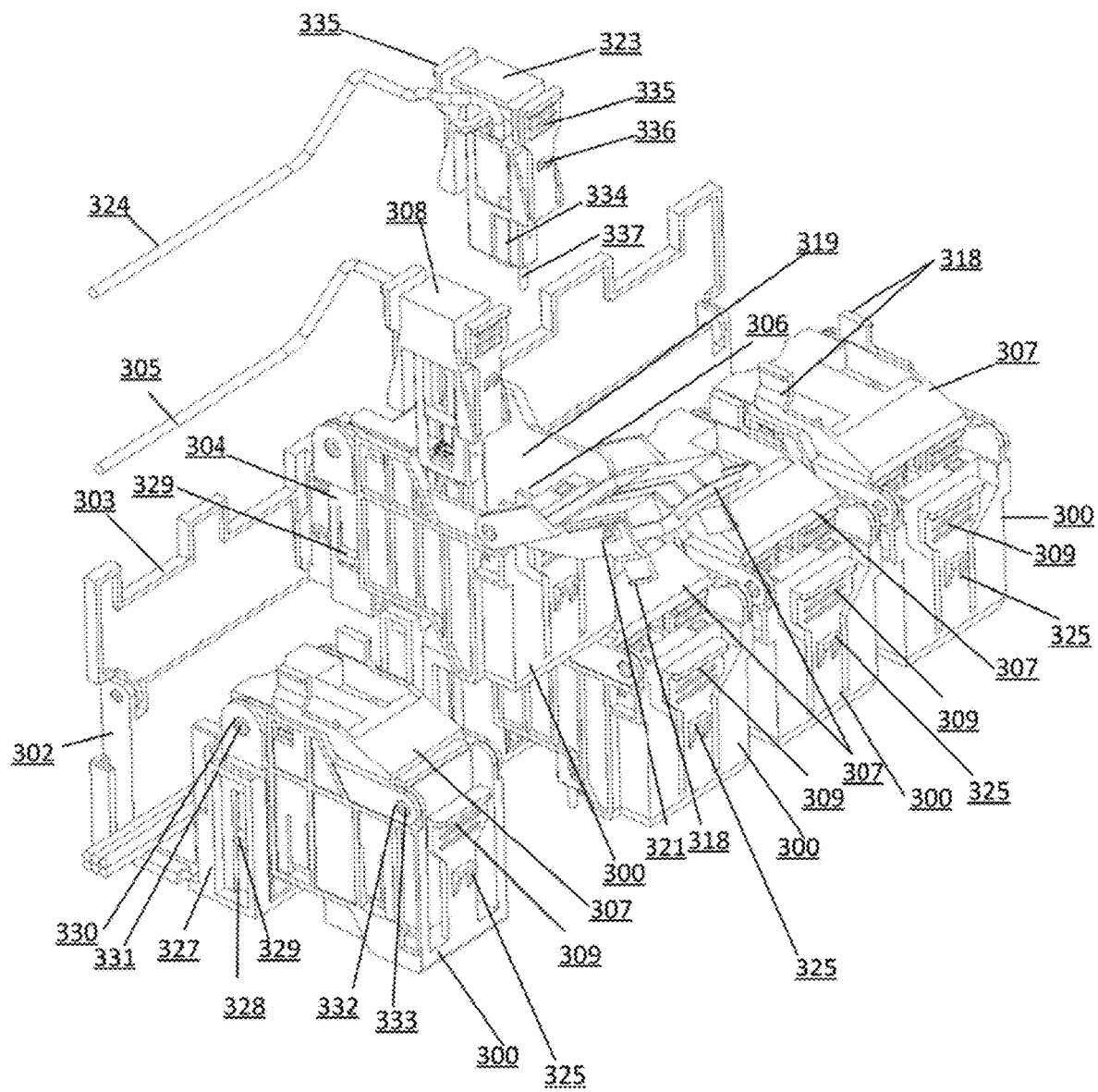
FIG. 5 is a perspective view of another example rocker-arm assemblies with connectable cable assemblies coupled to the connector bays of the rocker-arm assemblies.

FIG. 5 is a perspective view of another example rocker-arm assemblies 300 with connectable cable assemblies removably coupled to respective connector bays 306 of the rocker-arm assemblies 300. It should be understood that the rocker-arm assemblies 300 depicted in FIG. 5 may include additional components and that some of the components described herein may be removed and/or modified without departing from a scope of the rocker-arm assemblies 300.

The example system 300 comprises five rocker-arm assemblies 300 rotatably coupled to the stationary pivot plenum 302 by interposition of respective pivoting elements 304. The pivoting elements 304 are removably attached to the stationary pivot plenum 302 through respective guides 327. The guides 327 comprise respective retention openings 328 in which rocker-arm assembly retention tabs 329 of the pivoting elements 304 are inserted. The rocker-arm assembly retention tabs 329 are inserted in the retention openings 328 by applying pressure. The pivoting elements 304 further comprise two opposite parallel pivot holes 330 at their upper ends in which respective pivot posts 331 of the rocker-arm assemblies 300 are inserted. The rotatable movement of the rocker-arm assemblies 300 relative to the stationary pivot plenum 302 is performed by the two opposite parallel pivot holes 330 and the respective pivot posts 331.

The rocker arm assemblies 300 also comprise two opposite parallel pivot posts 332 that are inserted in respective opposite parallel pivot holes 333 in the movable covers 307. The combination of the two opposite parallel pivot posts 332 and the opposite parallel pivot holes 333 allows the cover 307 to move between an open position and a closed position. The movable cover 307 is retained in its closed position by two rocker-arm cover cantilever latches 318 with rocker-arm cover retention tabs 321 that are inserted in respective openings (not shown) in the rocker-arm assemblies 300. The rocker-arm cover retention tabs 321 avoid the unintentional aperture of the movable cover 307. The rocker-arm cover cantilever latches 318 are to be inwardly pressed to release the movable cover 307. When the movable cover 307 in its open position allows access to a conduit 319 in the rocker-arm assemblies 300 in which the cable assemblies are located. The conduit 319 has two connector bays 306 in which respective cable connectors 308,323 may be housed. The cable assemblies comprise respective cables 305,324 and cable connectors 308,323 which in turn comprises an optical ferrule 334 and an alignment pin 337.

In such example the rocker-arm assembly 300 comprises a snap or rocker-arm cantilever latch 309, such that the rocker-arm cantilever latch 309 on the rocker-arm assembly 300 engages into a slot of latch bracket on the electronic module (403 in FIG. 6A) when inserted, retaining the rocker-arm assembly 300 in its closed position by means of the rocker-arm retention tab 325. The rocker-arm cantilever latch 309 may be released from the latch bracket on the electronic module by pressing the tab end of the rocker-arm cantilever latch 309 on the rocker-arm assembly 300 to release the rocker-arm retention tab 325 from the latch bracket on the electronic module.

In such example, the cable connectors 308,323 comprise two snaps or connector cantilever latches 335 with connector retention tabs 336 that are inserted in respective openings (not shown) in the connector bays 306 of the rocker-arm assemblies 300. These connector retention tabs 336 engage into the respective openings when the cable connectors 308,323 are inserted in the connector bays 306, retaining the cable connectors 308,323 in their engaged position. The cable connectors 308,323 may be released from the connector bays 306 by inwardly pressing the upper end of the connector cantilever latches 335.

Figure 6A:
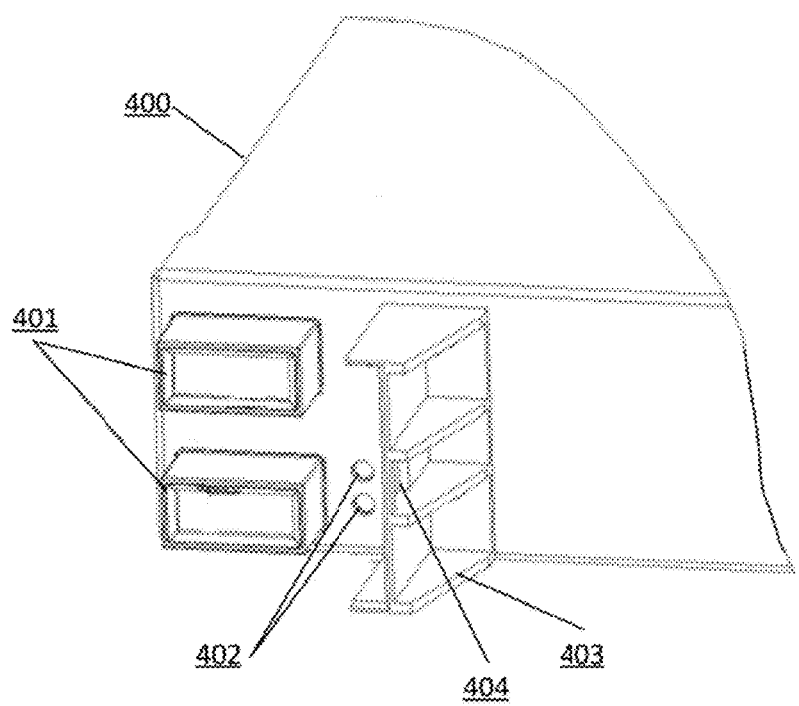
FIG. 6A is a perspective view of an example faceplate of an electronic module including indicators.
Figure 6B:
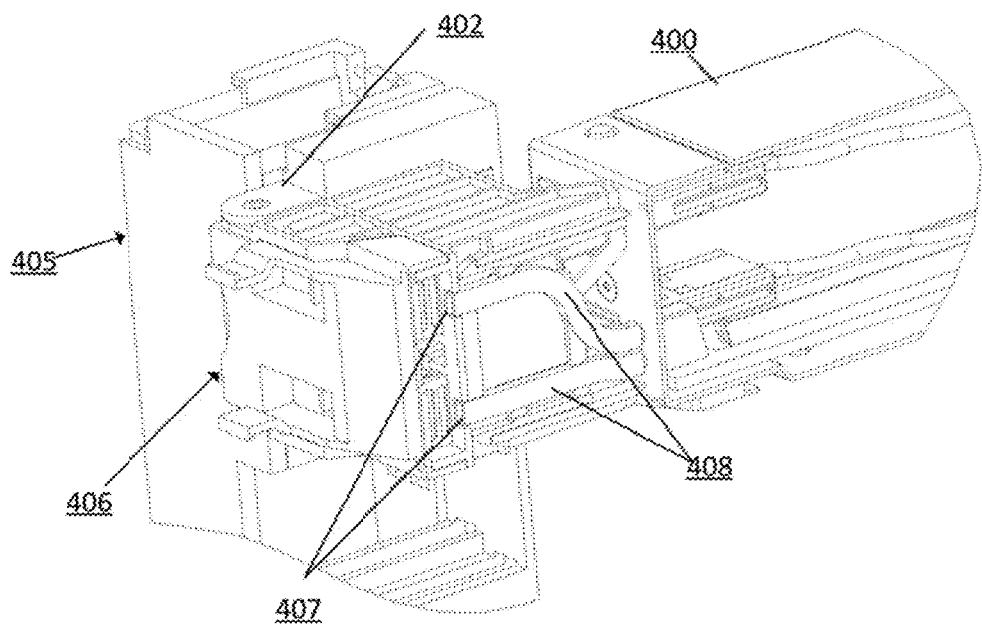
FIG. 6B is a perspective view and cross sectional of an example rocker-arm assembly engaged to the faceplate of FIG. 6A and including light pipes.

FIG. 6A is a perspective view of an example faceplate of an electronic module including indicators. FIG. 6B is a perspective and cross-sectional view of an example rocker-arm assembly engaged to the faceplate of FIG. 6B and including light pipes. It should be understood that the electronic module 400 depicted in FIGS. 6A and 6B and the rocker-arm assembly 406 depicted in FIG. 6B may include additional components and that some of the components described herein may be removed and/or modified without departing from a scope of the electronic module 400 and the rocker-arm assembly 406.

The module 400 in FIG. 6A comprises two connectors 401, for example optical connectors, a latch bracket 403 and a slot 404 on the latch bracket 403 for the rocker-arm assembly 406 depicted in FIG. 6B to be retained on the electronic module 400. The electronic module 400 further comprises two light indicators 402, for example two LEDs, that indicate the connection statuses of the respective connectors 401. For example, the upper light indicator may indicate the connection status of the upper connector and the lower light indicator may indicate the connection status of the lower connector. The light indicators 402 may indicate different connection status such as proper seating of cable connectors on the module connectors, operating status of a connection (e.g., fault or normal) cable connectors and module connectors, removal request approval for a particular cable connector from the respective module connector, Unit-ID (e.g., a flashing light to identify which rocker-arm to be removed), etc. The light indicators 402 may emit different colors and/or flashing patterns indicating different connection status.

The rocker-arm assembly 406 as depicted in FIG. 6B is rotatably coupled to a stationary pivot plenum 405 by interposition of a pivoting element 402. The rocker-arm assembly 406 comprises two respective light pipes 408 to transmit the light beams emitted by the light indicators 402 of the electronic module 400 to corresponding light indicators 407 on an upper surface of the rocker-arm assembly 406. In this way, the connection statuses of the connectors 401 are visible for a user when the rocker-arm assembly 406 is engaged to the faceplate of the electronic module 400.

Figure 7:
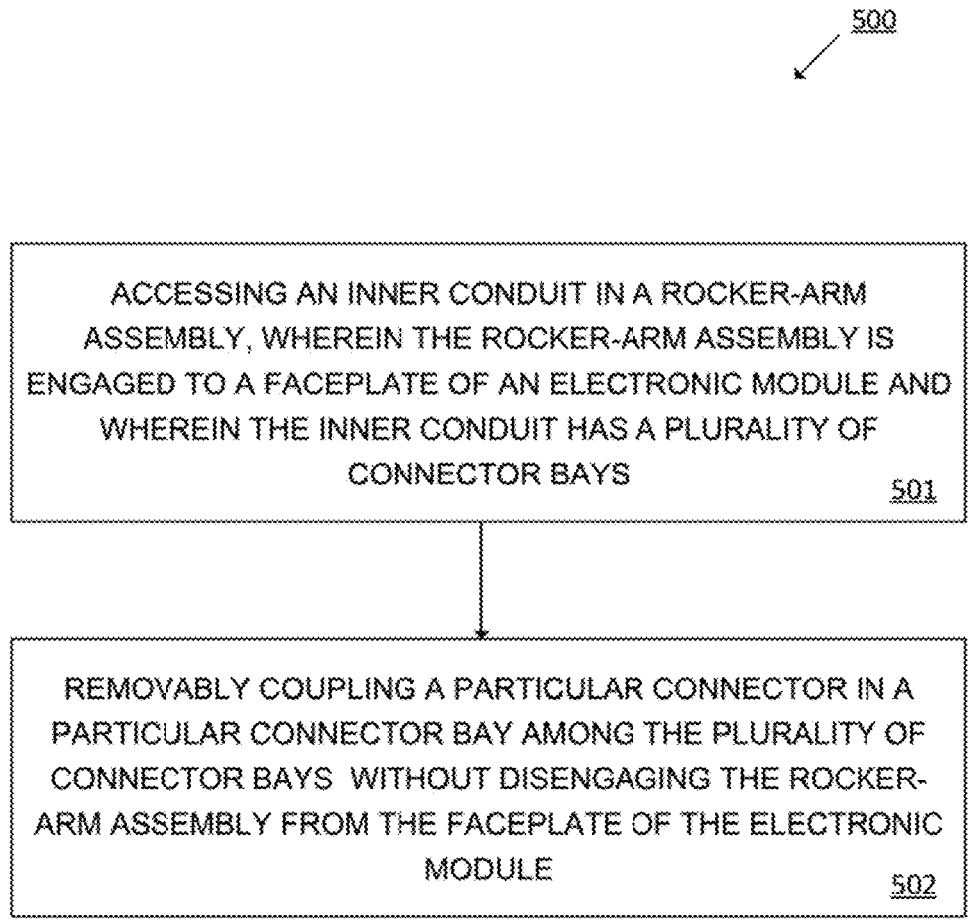
FIG. 7 is a flowchart of an example method for connecting removable cable assemblies to a rocker-arm assembly engaged to a faceplate of an electronic module.

FIG. 7 is a flowchart of an example method 500 for connecting removable cable assemblies to a rocker-arm assembly engaged to a faceplate of an electronic module. In some examples the rocker-arm assembly engaged to a faceplate of an electronic module may be any of the rocker arm assemblies described in FIGS. 1 to 6 although other suitable devices and systems for the execution of method 500 may be utilized. Additionally, implementation of method 500 is not limited to such examples.

At block 501 of method 500, the inner conduit of the rocker-arm assembly is accessed, for example, by opening the movable cover. In such example, the rocker-arm assembly is pivotally coupled to a stationary pivot plenum that may further comprise a movable cover to allow access to the cables or cable harnesses deployed within. The inner conduit comprises a plurality of connector bays and each connector bay is to removably house a cable connector. The cable connector may be an optical connector to transmit optical signals. In some other examples, the rocker-arm assembly is accessed through an opening instead of by opening a cover.

At block 502 of method 500, a particular cable connector is removably coupled to a particular connector bay among the plurality of connector bays of the rocker-arm assembly. The particular cable connector is to provide an additional service or resource to the electronic module. The coupling of the particular connector avoids disengaging the rocker-arm assembly from the faceplate of the electronic module or disengaging other cable connectors from their respective connector bays, and thus avoids disrupting the service provided by cable connector.

In some examples, the inner conduit of the rocker-arm assembly may be accessed to decouple a particular cable connector from the corresponding connector bay in which it is removably housed. The decoupling of the particular connector avoids disengaging the rocker-arm assembly from the faceplate of the electronic module or disengaging other connectors from their respective connector bays, and thus avoids disrupting the service provided by cable connector.

In some other examples, the inner conduit of the rocker-arm assembly may be accessed to service a particular cable connector that is removably coupled to a particular connector bay. The servicing of the particular connector avoids disengaging the rocker-arm assembly from the faceplate of the electronic module or disengaging other connectors from their respective connector bays, and thus avoids disrupting the service provided by cable connector.

In some examples, a set of light indicators located on the faceplate of an electronic module to which the rocker-arm assembly is engaged are interfaced with a contact surface of a corresponding set of light pipes housed in the rocker-arm assembly. The light pipes transmit light beams from the contact surface to an opposite end of the light indicators. For example, the light pipes may comprise light indicators at their opposite end for emitting the transmitted light beams. In this way the light indicators in the light pipes illuminate for the users to see. The light indicators on the faceplate of an electronic module and the light indicators on the rocker-arm assembly may be LEDs.

Plenum controller and system controller may be any combination of hardware and programming to implement the functionalities of the controllers described herein. In examples described herein, such combinations of hardware and programming may be implemented in a number of different ways. For example, the programming for controllers may be processor executable instructions stored on at least one non-transitory machine-readable storage medium and the hardware for engine may include at least one processor to execute those instructions. In some examples, the at least one machine-readable storage medium may store instructions that, when executed by the at least one processing resource, at least partially implement the controllers. In examples described herein, multiple controllers may be collectively implemented by a combination of hardware and programming, as described above. In other examples, the functionalities of the plenum controller and the system controller may be at least partially implemented in the form of electronic circuitry.

In some examples, the method 500 may also include providing feedback on the detected connectivity state. For example, as described above, an LED indicator disposed on a rocker-arm assembly may indicate via a color indication, the connectivity state. For example, an LED may illuminate, or flash, a certain color to indicate a connected state. Similarly, the LED may illuminate or flash other colors to indicate other statuses.

In some examples, the system controller may be notified when a request button (not shown) on the rocker-arm assembly is depressed by a user to request the disconnection of the rocker-arm assembly or to request the disconnection of a particular cable assembly in the rocker-arm assembly. The system controller may illuminate the light indicator of the rocker-arm assembly with a color to either allow or disallow the user to disconnect the rocker-arm assembly or the cable assembly.

Figure 8:
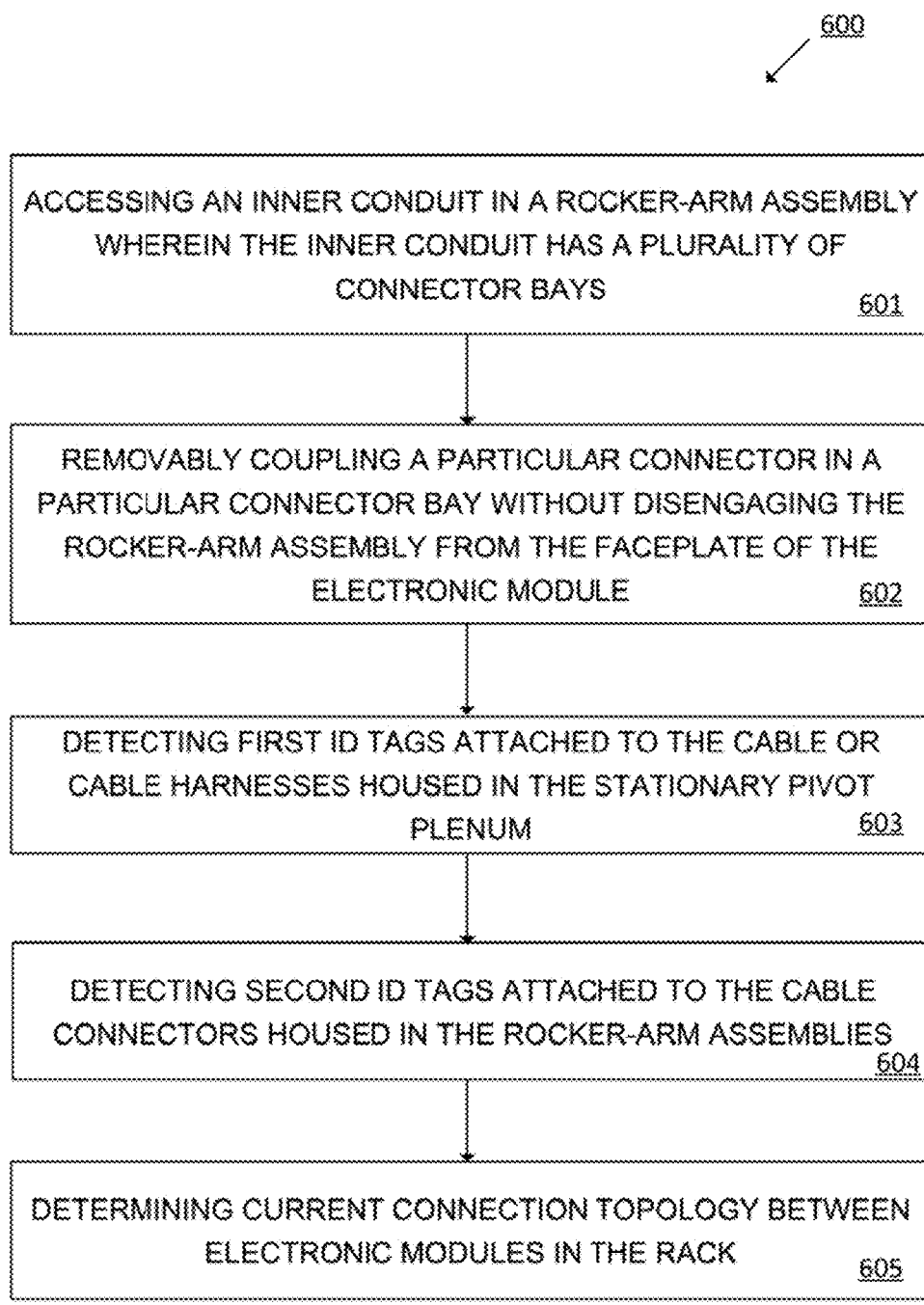
FIG. 8 is a flowchart of another example method for connecting removable cable assemblies to a rocker-arm assembly engaged to faceplate of an electronic module in a rack including detecting the connection topology in the rack.

FIG. 8 is a flowchart of an example method 600 for connecting removable cable assemblies to a rocker-arm assembly engaged to a faceplate of an electronic module in a rack, including detecting the connection topology in the rack. In some examples the rocker-arm assembly engaged to a faceplate of an electronic module may be any of the rocker arm assemblies described in FIGS. 1 to 6 although other suitable devices and systems for the execution of method 600 may be utilized. Additionally, implementation of method 600 is not limited to such examples.

At block 601 of method 600, the inner conduit of the rocker-arm assembly is accessed, for example, by opening the movable cover, wherein the inner conduit has a plurality of connector bays. At block 602 of method 600, a particular cable connector is removably coupled to a particular connector bay among the plurality of connector bays of the rocker-arm assembly without disengaging the rocker-arm assembly form the faceplate of the electronic module. At 603 of the method 600, antennas of a first ID reader located in the stationary pivot plenum detect first ID tags attached to the cable or cable harnesses housed in the stationary pivot plenum. The first ID reader communicates with a plenum controller located in the stationary pivot plenum. In turn, the plenum controller is connected to a system controller located in one of the electronic modules of the rack via the corresponding rocker-arm assembly. The first ID tags unequivocally identify each cable or cable harness to which they are attached. At 604 of method 600, second ID tags attached to the cable connectors are detected to identify the cable connectors that are installed on the connector bays of the rocker-arm assembly. The second ID tags unequivocally identify the cable connectors. In some examples, the second ID tags may be detected and read by the second ID readers located in the corresponding electronic modules. In another example, the second ID tags may be detected by antennas in the rocker-arm assembly, and read by the first ID reader in the stationary pivot plenum.

At 605 of method 600, a system controller in one of the electronic modules in the rack, determines, based on the information received from the plenum controller and the antennas in the rocker-arm assemblies, the current connection topology between the electronic modules in the rack. The connection topology may determine which cable connectors are connected to the respective connector bays, which connector bays are empty, etc.

In some other examples, the method may comprise automatically reconfiguring, by the system controller, the connection topologies among the electronic modules on the rack by managing optical circuit switch components located inside the stationary pivot plenum. The optical circuit switch components may activate or deactivate specific cable assemblies already deployed in the rocker-arm assemblies in response to management signals received from the system controller. The optical circuit switch components may also reroute the optical signals among the optical connectors in the rocker-arm assemblies in response to management signals received from the system controller.

In some other examples, the system controller may further detect the fully seated position of the cable connectors on the faceplate of the corresponding electronic module. For example, when a rocker-arm assembly engages with the connectors on the faceplate of an electronic module, there may be an actuation mechanism within the connector bays to detect the fully seated position of the connectors. The actuation mechanism may be connected to the system controller such that the system controller may turn on light indicators on the faceplate of the electronic module indicating that the cable connectors are fully seated. Alternatively, there may be a mechanical plunger on the rocker-arm assembly to actuate a push-button switch on the faceplate (not shown) to identify positive seating of the cable connectors.

Although the flowchart of FIG. 8 shows a specific order of performance of certain functionalities, method 500 is not limited to that order. For example, the functionalities shown in succession in the flowchart may be performed in a different order, may be executed concurrently or with partial concurrence, or a combination thereof. In some examples, functionalities described herein in relation to FIG. 8 may be provided in combination with features of devices described herein in relation to any of FIGS. 1 to 6.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed:

1. A device comprising:
    a stationary pivot plenum including a moveable cover to allow access to cables passing through the stationary pivot plenum; and
    a rocker-arm assembly pivotally coupled to the stationary pivot plenum, the rocker-arm assembly comprising:
        a connector bay within an inner conduit of the rocker-arm assembly;
        a cable assembly comprising a connector removably coupled within the connector bay, wherein the inner conduit is accessible from outside of the rocker-arm assembly for removing the connector from the connector bay and inserting the connector into the connector bay; and
        a cover movable between an open position in which access to the inner conduit of the rocker-arm assembly is allowed and a closed position in which access to the inner conduit of the rocker-arm assembly is prevented.

2. The device of claim 1, wherein the rocker-arm assembly is movable between an open position in which the rocker-arm assembly is disengaged from a faceplate of an electronic module and a closed position in which the rocker-arm assembly is engaged to the faceplate of the electronic module.

3. The device of claim 2, wherein the rocker-arm assembly comprises a retention mechanism to secure the rocker-arm assembly to the faceplate of the electronic module.

4. The device of claim 1, wherein the rocker-arm assembly is coupled to the stationary pivot plenum by interposition of a pivoting element.

5. The device of claim 1, wherein the cable assembly further comprises a cable and wherein the cable assembly is to provide a service to an electronic module.

6. The device of claim 5, wherein the cable is selected from a group comprising optical waveguides, optical fibers, electrical cables and a combination thereof.

7. The device of claim 6, wherein the connector is selected from a group comprising optical connectors, electrical connectors and a combination thereof.

8. The device of claim 1, wherein the rocker-arm assembly comprises light pipes to transfer light beams from indicators in a faceplate of an electronic module to which the rocker-arm assembly is engaged, and wherein the indicators in the faceplate of the electronic module are to indicate a connection state of connectors of the electronic module.

9. The device of claim 1, wherein the stationary pivot plenum comprises a first ID reader and a cable of the cable assembly comprises a first ID tag and the first ID reader is to detect cables housed in the stationary pivot plenum.

10. The device of claim 9, wherein the rocker-arm assembly comprises at least one antenna and the connector of the cable assembly comprises a second ID tag, the at least one antennas to detect the connector, using the second ID tag when the connector is inserted into the connector bay.

11. The device of claim 10, comprising a system controller that is to determine a connection topology between a set of electronic modules in a rack to which the rocker-arm assembly is engaged based on information received from the first ID reader in the stationary pivot plenum and the at least one antenna.

12. The device of claim 11, wherein the stationary pivot plenum comprises an optical circuit switch to automatically reconfigure connection topologies among the set of electronic modules to which the rocker-arm assembly is engaged.

13. A system comprising:
    a stationary pivot plenum including a moveable cover to allow access to cables passing through the stationary pivot plenum;
    a plurality of rocker-arm assemblies pivotally coupled to the stationary pivot plenum wherein the plurality of rocker-arm assemblies move between an open position in which the plurality of rocker-arm assemblies are disengaged from a faceplate of an electronic module and a closed position in which the plurality of rocker-arm assemblies are engaged to the faceplate of the electronic module; and
    wherein each rocker-arm assembly comprises:
        a connector bay within an inner conduit of the rocker-arm assembly;
        a cable assembly comprising a connector removably coupled within the connector bay, wherein the inner conduit is accessible from outside of the rocker-arm assembly for removing the connector from the connector bay and inserting the connector into the connector bay while the plurality of rocker-arm assemblies are engaged to the faceplate of the electronic module; and
        a cover movable between an open position in which access to the inner conduit of the rocker-arm assembly is allowed and a closed position in which access to the inner conduit of the rocker-arm assembly is prevented.

* * * * *